United States Patent [19]

Larson et al.

[11] Patent Number: 5,704,416
[45] Date of Patent: *Jan. 6, 1998

[54] TWO PHASE COMPONENT COOLER

[75] Inventors: Ralph I. Larson, Bolton, Mass.;
Richard L. Phillips, Alachua, Fla.

[73] Assignee: Aavid Laboratories, Inc., S. Lancaster, Mass.

[ * ] Notice: The term of this patent shall not extend beyond the expiration date of Pat. No. 5,458,189.

[21] Appl. No.: 303,857

[22] Filed: Sep. 9, 1994

Related U.S. Application Data

[63] Continuation-in-part of Ser. No. 120,153, Sep. 10, 1993, Pat. No. 5,458,189.

[51] Int. Cl.$^6$ .................................................. F28D 15/00
[52] U.S. Cl. ............... 165/104.33; 165/46; 165/104.21; 361/700; 257/715
[58] Field of Search .......................... 165/46, 104.21, 165/104.33; 361/700, 701, 702; 257/714, 715

[56] References Cited

U.S. PATENT DOCUMENTS

| | | | |
|---|---|---|---|
| 2,961,476 | 11/1960 | Maslin et al. | 165/104.33 |
| 3,256,703 | 6/1966 | Selwitz | 165/46 |
| 3,330,130 | 7/1967 | Schraith et al. | 62/259 |
| 3,332,476 | 7/1967 | McDougal | 165/51 |
| 3,402,761 | 9/1968 | Swet | 165/32 |
| 3,404,730 | 10/1968 | Kurisa | 165/104.33 X |
| 3,481,393 | 12/1969 | Chu | 165/104.33 X |
| 3,512,582 | 5/1970 | Chu et al. | 361/700 X |
| 3,517,730 | 6/1970 | Wyatt | 165/32 |
| 3,604,503 | 9/1971 | Feldman, Jr. et al. | 165/32 |
| 3,613,773 | 10/1971 | Hall et al. | 165/32 |
| 3,682,237 | 8/1972 | Islo | 165/1 |
| 3,741,292 | 6/1973 | Aakalu et al. | 165/104.33 |
| 3,863,710 | 2/1975 | Masters | 165/46 |
| 4,036,291 | 7/1977 | Kobayashi et al. | 165/104.33 X |
| 4,072,188 | 2/1978 | Wilson et al. | 165/80.3 |
| 4,212,347 | 7/1980 | Eastman | 165/46 |
| 4,295,342 | 10/1981 | Parro | 165/104.21 |
| 4,330,033 | 5/1982 | Okada et al. | 165/104.27 |
| 4,333,517 | 6/1982 | Parro | 165/1 |
| 4,787,843 | 11/1988 | Huffman | 165/104.27 |
| 4,847,731 | 7/1989 | Smolley | 165/104.26 |

(List continued on next page.)

FOREIGN PATENT DOCUMENTS

| | | | |
|---|---|---|---|
| 1266244 | 5/1961 | France . | |
| 1319387 | 1/1963 | France . | |
| 0126558 | 11/1978 | Japan | 165/104.33 |
| 53-145141 | 12/1978 | Japan . | |
| 0030552 | 3/1979 | Japan | 165/104.33 |
| 0128286 | 10/1979 | Japan | 165/104.33 |
| 1037899 | 2/1989 | Japan | 361/700 |
| 2067792 | 3/1990 | Japan | 361/700 |
| 0832607 | 5/1981 | U.S.S.R. | 165/104.33 |

OTHER PUBLICATIONS

Controlling Pressure Changes in a Liquid Encapsulated Module, Aakalu et al., IBM Technical Disclosure Bulletin, vol. 14, No. 8, Jan. 1972, p. 2533.

*Primary Examiner*—John Rivell
*Assistant Examiner*—Christopher Atkinson
*Attorney, Agent, or Firm*—Cohen, Pontani, Lieberman & Pavane

[57] ABSTRACT

A two-phase liquid cooling system has a container structure that has at least one wall with sufficient flexibility that the wall expands as the coolant vapor expands thereby maintaining the internal container pressure substantially the same as the ambient environmental pressure. Coolant boiling overshoot is reduced by allowing residual gases to remain in the cooling system. More particularly, sufficient residual gas is maintained in the system so that some of the gas dissolves in the liquid coolant when the device is not operating and is at ambient temperature. During warm-up, the residual gas comes out of solution and creates nucleation sites that initiate boiling and prevent overshoot. Additional nucleation sites can also be added to reduce overshoot by treating the inside surfaces of the container structure, for example by laser machining, to create nucleation sites.

18 Claims, 11 Drawing Sheets

U.S. PATENT DOCUMENTS

| | | | |
|---|---|---|---|
| 4,912,548 | 3/1990 | Shanker et al. | 165/104.33 |
| 4,951,740 | 8/1990 | Peterson et al. | 165/32 |
| 4,971,138 | 11/1990 | Lowenstein | 165/46 |
| 4,995,451 | 2/1991 | Hamburgen | 165/104.33 |
| 4,997,032 | 3/1991 | Danielson et al. | 165/46 |
| 4,997,034 | 3/1991 | Steffen et al. | 165/104.34 |
| 5,000,256 | 3/1991 | Tousignant | 165/46 |
| 5,046,552 | 9/1991 | Tousignant | 165/46 |
| 5,168,919 | 12/1992 | Berenholz et al. | 165/80.4 |
| 5,195,577 | 3/1993 | Kameda et al. | 165/104.33 X |
| 5,198,889 | 3/1993 | Hisano et al. | 361/701 X |
| 5,205,348 | 4/1993 | Tousignant et al. | 29/890.03 |
| 5,206,791 | 4/1993 | Novotny | 165/185 |
| 5,249,358 | 10/1993 | Tousignant et al. | 165/46 |
| 5,458,189 | 10/1995 | Larson et al. | 165/104.33 |

TWO PHASE COMPONENT COOLER

CROSS REFERENCE TO RELATED APPLICATIONS

This application is a continuation-in-part of our U.S. Pat. No. 5,458,189, designated Ser. No. 08/120,153, filed Sep. 10, 1993, entitled "Two Phase Component Cooler. This application contains subject matter related to commonly assigned U.S. patent application designated Ser. No. 08/215,541, filed Mar. 22, 1994, entitled "Two Phase Bag Component Cooler" now U.S. Pat. No. 5,485,671.

FIELD OF THE INVENTION

This invention relates, in general, to cooling apparatus for heat dissipating components including electronic devices, such as discrete electronic components and integrated circuit chips, and, in particular, to cooling apparatus which utilizes both a liquid phase and a vapor phase of a coolant to provide enhanced heat transfer.

BACKGROUND OF THE INVENTION

Traditional methods of cooling various components, such as electrical components, have often involved air convection cooling. In such cooling heat dissipated by an electronic component is transferred to the surrounding air which carries the heat to an ultimate sink, generally, the room in which the component is located. The heat transfer process can be enhanced by increasing the surface area of contact between the component and the air, for example by using fins on the component or by mounting the component on a heat sink to which heat is transferred by conduction and which then dissipates heat by convection. The heat sink may itself have fins to promote convection. In addition, convection may occur by natural air circulation or by forcing the air to circulate by means of fans or blowers. Such traditional air convection cooling functions well, but has significant limitations.

For example, as modern day electronic equipment has become more sophisticated and more compact, electronic component density has steadily increased; this trend has been mirrored in integrated circuit packages in which functionality has been increased without a corresponding increase in package size by greatly increasing the number and density of active devices, such as transistors, within the packages.

As the number of active devices has increased within a fixed package volume, heat dissipated by these devices has also increased to the point where, in many modern day devices, the power density is so high that conventional air convection cooling methods, even using forced air circulation, cannot remove the dissipated heat sufficiently fast in order to keep the circuit package within its allowed operating temperature range. Further, forced air convection cooling methods also have practical limits because the high air flow required to provide sufficient cooling in many high-powered systems can create an unacceptable noise level in a relatively quite environment such as an office.

Consequently, several liquid cooling techniques have conventionally been used with high-power electronic components. These techniques generally fall into two broad groups comprising single phase and two phase cooling systems. In a single phase liquid cooling system, the liquid coolant remains as a liquid over the normal operating range of the system. This is in contrast to a two phase cooling system in which the liquid coolant changes from its liquid phase to a vapor phase during at least one point in the normal operating range.

An example of a single phase liquid cooling system which uses natural convection comprises a hermetic enclosure which encloses the heat-generating component device. The enclosure may be provided with external fins and is filled with a conductive liquid coolant. Heat is transferred from the heat dissipating component to the coolant mainly by conduction and from the coolant to the enclosure by natural convection. The enclosure itself may be cooled by circulating air around the outside of the enclosure. Such a cooling method is effective but involves additional problems, such as chemical incompatibilities between the component and the coolant and difficulty of maintaining the component.

Other single phase cooling systems do not immerse the heat-generating component directly in the liquid coolant, but instead confine the coolant in a container. Heat is conducted from the generating component through the container wall into the liquid coolant which then dissipates the heat by natural convection. An example of such a cooling system uses a sealed flexible bag which is filled with a liquid coolant. The bag may be constructed from a flexible plastic film which is relatively impermeable to both air and the liquid coolant. The bag is placed in contact with the heat-dissipating component and, since the bag is flexible, it conforms to the component shape and heat is transferred through the relatively thin plastic film to the coolant. Other embodiments of this type of system use metal inserts to more efficiently conduct the heat from heat-dissipating component to the coolant. Examples of coolant bag systems are shown in U.S. Pat. Nos. 4,997,032 and 5,000,256.

While such single phase systems can be useful in many situations their heat transfer rate is still relatively low, and, consequently, they cannot be used with a high-power electronic components unless they have a relatively large volume which is incompatible with most compact electronic systems available today.

Single phase forced convection designs have also been used. In these latter designs, the heat-dissipating component is located inside a small enclosure through which liquid coolant is pumped. The coolant is generally recirculated between the component enclosure and a liquid-air heat exchanger (occasionally a liquid-liquid heat exchanger is used) where the heat is dissipated by either natural or forced convection. These latter cooling systems can dissipate large amounts of heat, but are subject to leaks and require pumps for operation.

Consequently, two phase liquid cooling systems have been used to overcome the problems of single phase systems. In a conventional two phase cooling system, a low boiling point liquid coolant is used; the liquid is vaporized or boiled by heat dissipated by the electronic component and the vapor travels to a condenser. In the condenser the coolant vapor is converted back into a liquid and the liquid is then returned to the heat dissipating component so that the boiling/condensing cycle can be repeated.

An example of a two phase device in which the heat dissipating component is directly immersed in the coolant is shown in U.S. Pat. No. 3,741,292. The heat dissipating component is located in a hermetic enclosure which contains a sufficient pool of low boiling point dielectric liquid coolant to partially fill the enclosure and immerse the heat dissipating component. The liquid is evaporated by the heat dissipated by the component and the resulting vapor is collected in the enclosure space located above the liquid pool. This enclosure space is filled with fins extending inwardly into the enclosure which fins serve as a condenser for the coolant vapor. The enclosure is also equipped with external fins which serve as an air cooled heat sink to cool the enclosure. As the vapor condenses it runs back into the liquid pool under the influence of gravity. Another type of two phase cooling system which does not directly immerse the component in the coolant is a heat pipe system. A heat pipe consists of an elongated, hermetic container with thermally conductive walls, for example, a copper pipe is often used. One end of the container acts as an evaporator and the other end acts as a condenser. A wick or other capillary device extends along the length of the container—if a copper pipe is used, the wick often consists of a fine mesh screen extending along the inside of the pipe. The container is partially filled with a low boiling point liquid coolant and the residual non-condensing gases are purged. More particularly, during construction of the heat pipe, the air which normally fills the container is purged by boiling the coolant to drive off the air. The container is then sealed.

The evaporator end is mounted next to the heat dissipating component and heat is transferred by conduction through the container wall of the device. As the coolant evaporates or boils, the resulting vapor travels down the container to the condenser end where it condenses back to a liquid. The liquid is returned to the evaporator end by means of the wick (or alternatively by gravity).

The direct immersion enclosure and the heat pipe can transfer heat efficiently away from a heat dissipating component, but also have limitations. More specifically, both the direct immersion enclosure and indirect heat pipe two phase devices utilize rigid, hermetically sealed containers and, thus, the internal pressure of the devices does not remain equal to the ambient environmental pressure. For example, in a heat pipe device, most of the non-condensable residual gas is purged during manufacture to prevent excessive pressures in the device in the normal temperature operating range. Consequently, when the device is not operating, there usually exists a slight vacuum in the device at normal ambient temperature. Accordingly, the device is prone to leaks, and, if a leak occurs, air will be drawn into the device. Later, when the device is operating, the increased pressure produced by the air may drive some of the liquid out of the container. Consequently, the devices are not reliable in an environments where long term maintenance is impossible.

Further, due to the fact that the container walls are rigid, as the liquid coolant vaporizes, the pressure inside the prior art devices increases, in turn, increasing the coolant boiling point. The increase in boiling point is exacerbated by the presence of residual air and air introduced into the system by leaks. Consequently, the coolant liquid within the devices does not have a single boiling point but rather a range of boiling points and the devices do not operate at a single temperature but instead operate over a relatively broad range of temperatures.

Further, such devices are often subject to a phenomenon called "overshoot". Overshoot occurs during device warm-up because the liquid coolant does not begin to boil when it reaches its boiling point. Instead, the liquid temperature continues to increase until the temperature is significantly over the normal coolant boiling temperature and boiling suddenly erupts. When boiling finally does occur, the device temperature returns to its normal operating temperature range. Overshoot is highly undesirable as it stresses the components to be cooled and, in some cases, may cause a component to temporarily operate outside its normal operating temperature range. An additional problem with two phase cooling systems is the detrimental effect low ambient pressure and high ambient temperature can have on the system's cooling ability.

Accordingly, it is an object of the present invention to provide a cooling system for electronic components which has a high heat transfer rate and can maintain the electronic component within a relatively narrow temperature range. Additional objects achieved by various embodiments of the invention are to provide cooling systems which do not require maintenance, are reliable over a long time period and which are not subject to overshoot. A further object of the present invention is to provide a cooling system which retains a high level of cooling capability even at low ambient pressure and high ambient temperature.

SUMMARY OF THE INVENTION

According to an aspect of the present invention a two phase liquid cooling system has a structure in which the internal pressure of the system remains substantially equal to the ambient environmental pressure over the entire thermal operating range. Operation within the limited thermal operating range without an internal pressure change is achieved by constructing the system with at least one flexible container wall having a limited range of expansion. The wall has sufficient flexibility that the wall expands as the coolant vapor expands thereby maintaining the internal container pressure substantially the same as the ambient pressure within the limited range of expansion. Once the wall has expanded to its limit, the internal pressure increases above the ambient pressure which facilitates the liquid coolant point being shifted to a slightly higher temperature. Consequently, by controlling the limited amount the wall can expand, along with the amount of the liquid coolant boils within a single, very narrow temperature range and the inventive device can maintain a heat dissipating device within that range.

In one embodiment of the invention, the cooling system consists of a rigid evaporator unit which is attached to the heat dissipating component and a condenser unit. The evaporator unit and the condenser unit are connected together by rigid or semi-flexible tubes. The condenser is constructed with at least one wall that is sufficiently flexible to maintain the internal pressure of the system substantially at the ambient pressure. In addition, residual, non-condensing gases such as air are not purged from the system, but remain in the system so that when the device is not operating, the internal pressure remains, near to, or substantially at ambient pressure. Thus, the inventive device is not prone to the leaking problem that is found in prior art heat pipes.

According to another aspect of the present invention, a two phase liquid cooling system has a flexible wall structure with limited expansion capability which expands in order to maintain the internal ambient pressure of the system substantially equal to the ambient environmental pressure over a limited range of ambient conditions, and which allows the internal pressure to increase above ambient pressure in order to increase the cooling ability of the system in more demanding ambient conditions.

In this embodiment of the present invention, the system includes a rigid evaporator unit which is attached to the heat dissipating component and condenser unit. The evaporator unit and the condenser unit are connected together by rigid or semi-flexible tubes. The condenser is constructed of at least one flexible wall having limited expansion capability, wherein the wall expands to maintain the internal pressure of the system substantially at the ambient pressure until the wall has expanded to the maximum allowable volume.

The embodiments of the invention reduce the overshoot problem of the prior art devices by allowing residual gases to remain in the cooling system. More particularly, sufficient residual gas is maintained in the system so that some of the gas dissolves in the liquid coolant when the device is not operating and is at ambient temperature. During warm-up, the residual gas comes out of solution and creates nucleation sites that initiate boiling and prevent overshoot. Additional nucleation sites can also be added to reduce overshoot by treating the inside surface of the evaporator unit, for example by laser machining, to create nucleation sites.

More particularly, in accordance with another aspect of the invention, the rigid evaporator can be either an integral part of the component package or a separate part which is attached to the component package. The evaporator unit and the condenser unit are interconnected via one or more flexible pipes which can be preferably made of plastic tubing. In operation, the coolant liquid is evaporated or boiled in the evaporator unit and travels to the condenser unit where the liquid condenses. The condensed liquid is returned to the evaporator unit by gravity.

In accordance with yet another aspect of the invention, the condenser unit can be made entirely of a polymeric material. For example, the condenser may be entirely constructed of thin, flexible polymeric films or sheets. Alternatively, a portion of the condenser can be constructed of thicker polymeric material by means of injection molding or blow molding and the remaining portions constructed of flexible polymeric material films in order to provide a flexible wall to maintain the internal pressure equivalent to the ambient pressure.

In accordance with another embodiment of the invention, a portion of the condenser is constructed of sheet, or molded, metal or plastic formed with fins for enhanced heat transfer and a thin polymeric sheet is sealed to the metal condenser portion to provide a flexible wall. In yet another embodiment, a portion of the condenser is constructed of a rigid metal such as aluminum having folded fins attached to the aluminum portion of the condenser for enhanced heat transfer, and a thin polymeric sheet is sealed to the metal condenser to form the flexible wall.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
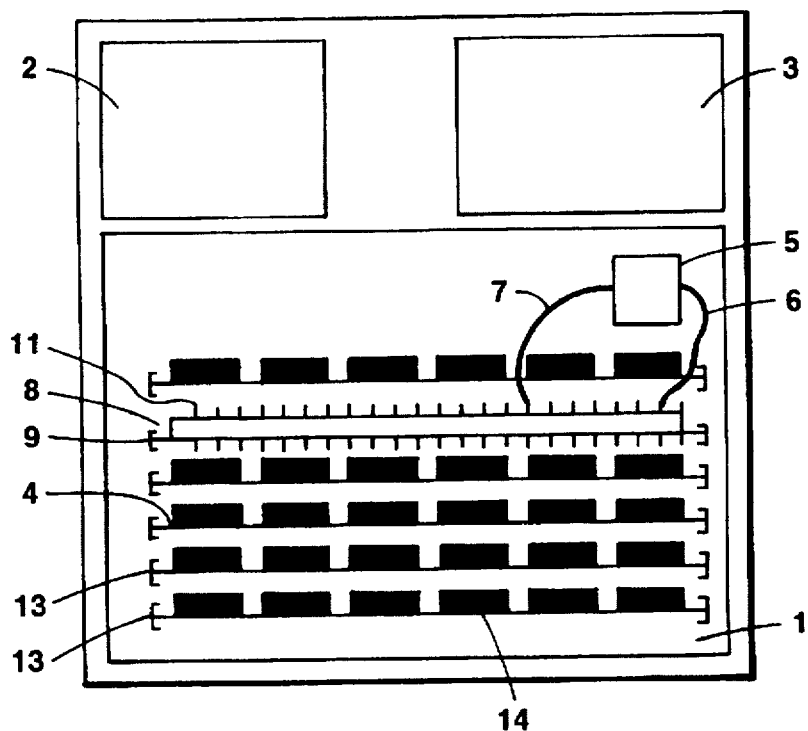
FIG. 1 is a schematic top view of an electrical component system, such as might be used in a personal computer, which system includes a plurality of expansion boards and incorporates one embodiment of the present invention including an evaporator and a condenser.
Figure 2:
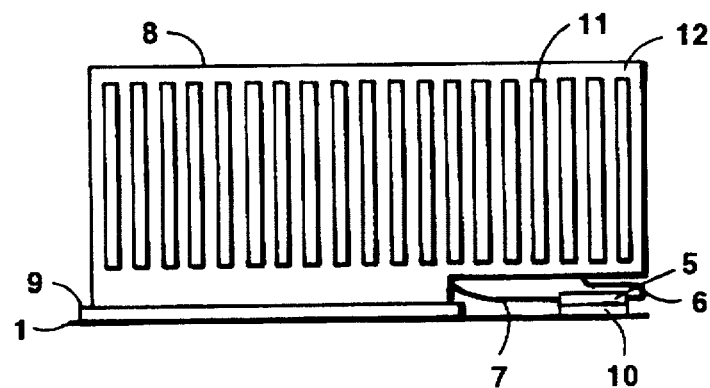
FIG. 2 is a side view of the printed circuit board shown in FIG. 1 with some of the expansion boards removed to show the condenser unit.
Figure 3:
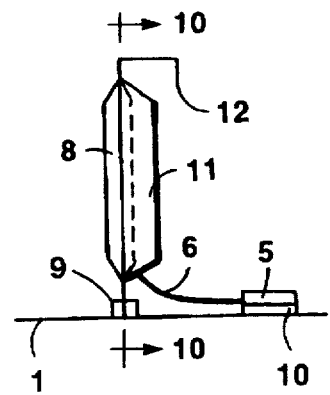
FIG. 3 is a front view of the printed circuit board with some of the expansion boards removed to illustrate the condenser and its fins.

FIG.1 is a schematic top view of a main printed circuit board or "mother board" of the type that is commonly used in a personal computer system. FIGS. 2 and 3 show the side and front views of mother board 1, respectively. Mother board 1 has a number of components mounted thereon which comprise the personal computer circuitry. These components include a power supply which is shown schematically as box 2 and a disc drive schematically shown as box 3. In addition, mother board I would normally be populated with many integrated circuit chips which are not shown in FIG. 1 for clarity. Typically, one more of such integrated circuit chips would be high-power chips and would be candidates for one or more of the cooling devices of the present invention. Such high-power chips might, for example, comprise the microprocessor of the personal computer system.

In a conventional personal computer system, empty card slots are provided for "expansion cards" which can be inserted by the user to add additional features to the computer. In FIG. 1, a number of expansion card boards 4 are shown inserted into sockets 9 and 13. Each of the boards has a plurality of integrated circuit chips 14 mounted thereon. Boards 4 have been omitted from the side and front views of FIGS. 2 and 3 in order to expose the condenser unit 8 of the present invention. Although several boards 4 are shown inserted into mother board I in FIG. 1, it should be understood that, in a typical computer system, there may be no expansion boards inserted in the slots or all of the slots may be filled with expansion boards.

As will hereinafter be explained in detail, in one preferred embodiment of the invention, the condenser unit 8 of the inventive cooling system is designed to fit into an empty expansion card socket 9, thereby fixing the condenser unit 8 in a vertical position which is ideal for coolant drainage and to allow optimum air circulation around fins 11. FIG. 2 shows a side view of the mother board 1 shown in FIG.1 which illustrates the condenser unit 8 construction in more detail.

As shown in FIG. 2, condenser unit 8 is equipped with fins 11 which increase the surface area and aid in transferring heat between the condenser unit 8 and the surrounding air. Typically, fins 11 are hollow and communicate with the interior of the condenser unit 8 so that the fins also increase the amount of surface area presented to the coolant vapor within the condenser unit 8, thereby increasing the heat transfer from the vapor to the condenser unit 8.

FIG. 3 shows a front view of the mother board 1 with the expansion cards 13 removed illustrating the condenser unit 8. The condenser unit 8 is shown with fins 11 on one side however, fins maybe mounted on one or both sides of the condenser unit 8. In addition, hook 12 is formed at the top of the condenser unit 8, which hook allows the condenser unit 8 to be hung from the top of an existing expansion board if no empty expansion slot sockets are available (hook 12 has been omitted from FIG.1 to illustrate fins 11).

The evaporator unit 5 of the inventive cooling system is illustratively shown mounted on top of a high-power integrated circuit chip 10 which is not visible in FIG. 1, but is shown in FIGS. 2 and 3. Evaporator unit 5 is connected to the condenser unit 8 by means of coolant tubes 6 and 7. Liquid coolant (not shown) in evaporator unit 5 is evaporated by heat dissipated by circuit 10 and the coolant vapor (not shown) is conveyed by vapor tube 6 to condenser unit 8 where the vapor condenses to a liquid and the liquid returns to the evaporator unit 5 via the condensate tube 7 under the influence of gravity.

Figure 4:
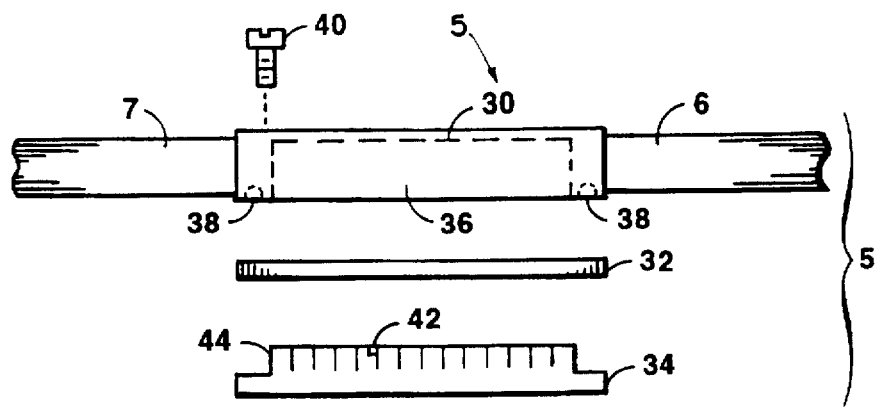
FIG. 4 is an exploded view of the evaporator unit illustrating one manner of assembling the evaporator unit.
Figure 5:
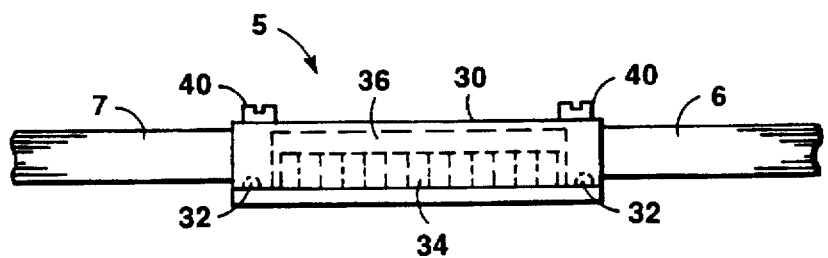
FIG. 5 is an assembled view of the evaporator unit.

FIG. 4 shows an exploded view of the evaporator unit 5. As previously mentioned, the evaporator unit 5 can be either an integral part of the electronic component package or manufactured separately and attached to the package. The construction illustrated in FIG. 4 is designed to be manufactured separately and attached to the component package during, or after, assembly of the printed circuit board 1.

The evaporator unit 5 consists of an evaporator cover 30 which may be made of metal or, preferably, polymeric material. The evaporator cover 30 has a recess 36 which receives a heat spreader plate 34 which conducts the heat generated by the heat dissipating component into the interior of the evaporator unit 5. The heat spreader plate 34 is sealed to the evaporator cover 30 by means of an O-ring seal 32 which fits into groove 38 in cover 30. In a preferred embodiment, the O-ring seal 32 is replaced with an epoxy sealer. It is believed that the O-ring seal 32 may be prematurely susceptible to cracking since the liquid coolant in contact with the O-ring seal may leach plasticizer materials from the seal and over time cause the seal to become brittle and crack. In the embodiment shown in FIG. 4, the heat spreader plate 34 and the evaporator cover 30 are fastened together by means of screws 40. Alternatively, it is also possible to attach the heat spreader plate 34 to the evaporator cover 30 by means of epoxy cement, compression seals or other arrangements.

Figure 8:
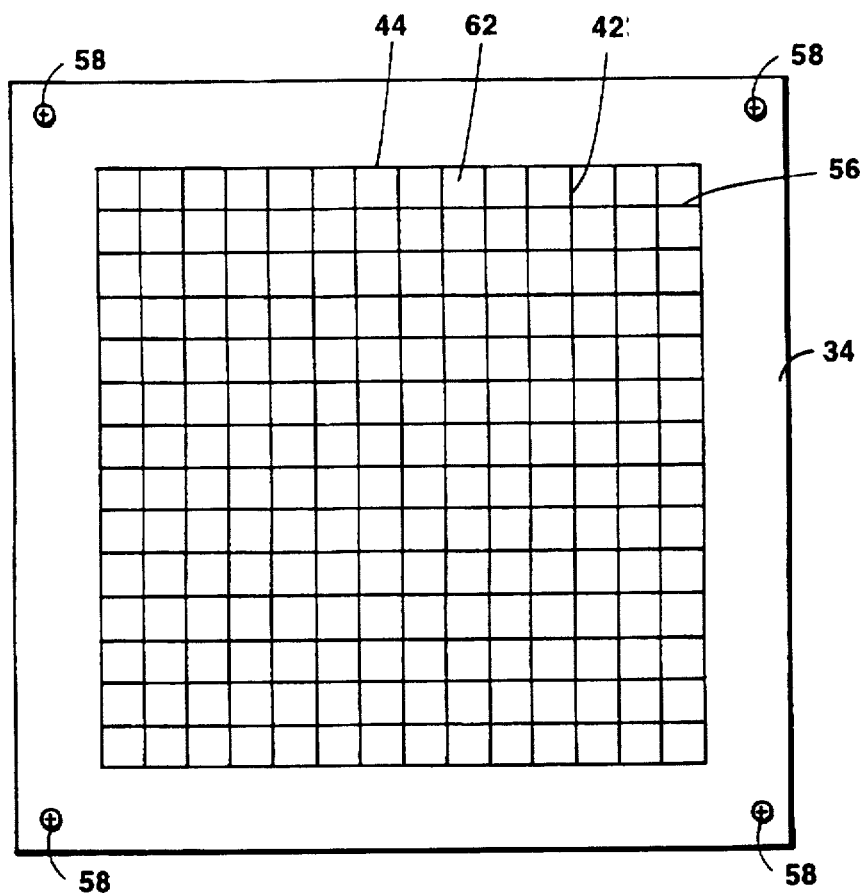
FIG. 8 is a top view of one embodiment of a heat spreader plate showing heat spreading fins formed by grooves cut in the plate.

The heat spreader plate 34 is also shown in more detail in FIG. 8 and can be smooth or flat in cooling systems designed for low-power components, however pin fins or tab fins may be used in high-power designs to help draw the coolant into the hottest areas of the spreader plate. In the design shown in FIGS. 4 and 8, heat spreader plate 34 has a raised portion 44 which fits into the recess 36 of the evaporator cover 30 and raised portion 44 may have slots 42 cut in it to increase the surface area and to form fins in the plate surface. The heat spreader plate 34 is generally made of a high-conductivity material such as copper, diamond-copper composite, aluminum or, in some cases, high-conductivity plastic materials. The heat spreader plate 34 is provided with four threaded holes, 58, into which screws 40 are threaded to hold plate 34 to the evaporator unit cover 30.

The evaporator unit 5 can be attached to the integrated circuit chip 10 using a variety of conventional techniques. For example, the evaporator unit 5 can be attached to the chip 10 by epoxy cement, soldering, thermal grease or contact pressure (applied by means of clips or springs). It is also possible to make the evaporator cover 30 and the heat spreader plate 34 of porous materials in which case the evaporator unit 5 can be attached to the chip 10 by means of capillary suction forces.

Figure 6:
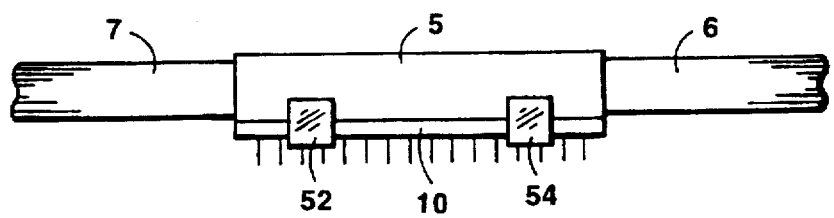
FIG. 6 is a side view of the evaporator unit mounted on the heat dissipating component illustrating the use of clips to hold the evaporator on the component.
Figure 7:
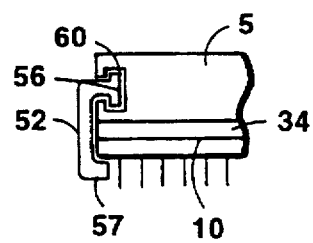
FIG. 7 is a partial sectional view of the evaporator unit illustrating the manner of attaching the clips to the evaporator unit and to the component.

Illustrative C-shaped clips or springs 52 and 54 are shown in FIG. 6 which clips attach the evaporator unit 5 to the chip 10. FIG. 7 shows a partial cross sectional view of the evaporator unit 5 showing a T-shaped channel 60 molded into the wall of the evaporator unit 30. Each C-shaped clip 52 has a T-shaped end 56 which fits into the channel 60 and fastens the clip to the evaporator unit 5. A right angle bend 57 at the lower part of each clip, such as clip 52, slips over the lower edge of chip 10 and holds the evaporator unit 5 firmly to the chip 10.

Figure 17:
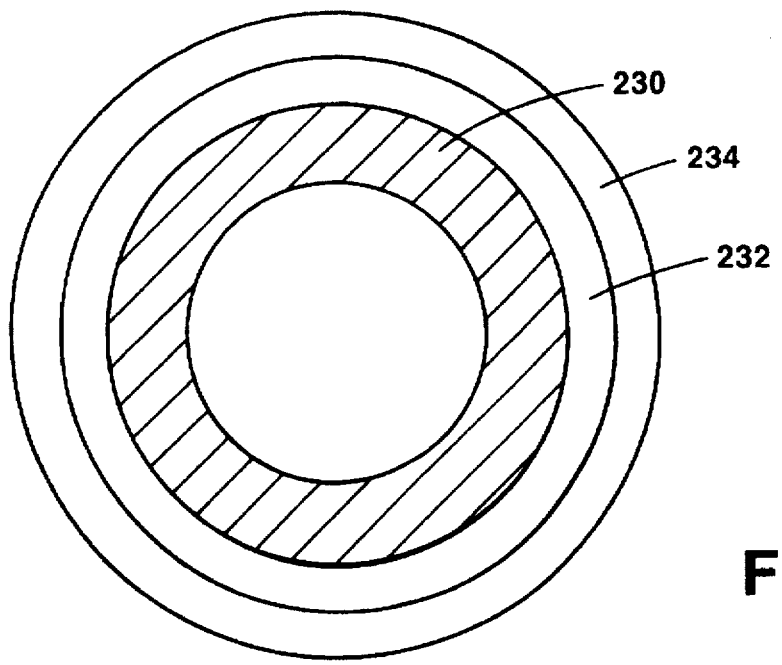
FIG. 17 is a cross sectional view of the condensate and vapor tubes.

The evaporator unit 5 and the condenser unit 8 are connected together, via one or more tubes, of which tubes 6 and 7 are shown. Typically, these tubes are flexible may be made of flexible plastic tubing such as TYGON™ tubing. FIG. 17 illustrates cut-away view of a preferred embodiment for the tubes 6 and 7 including an inner tubing 230 formed of polyurethane, surrounded by a thin coating 232 of SERFINE™ TX76-52 produced by Morton Salt Company which forms a low permeability barrier air surrounding the polyurethane. This coating is added to the tubing primarily to minimize the amount of air diffused into the system. In addition, when the system is being manufactured it is filled with predetermined amounts of liquid coolant and air which reduces the overshoot problems discussed hereinbefore. Air in excess of this predetermined amount is not required, and in fact the excess can often be detrimental to the system's performance since it may cause fouling of the condenser which can reduce the system's efficiency in condensing the coolant vapor. If inward diffusion of air is a problem, it is contemplated that the system may be slightly pressurized during manufacture and sealed to provide an internal pressure slightly higher than ambient. It should also be mentioned that the preferred coolants such as FLUORINERT™ produced by Minnesota Mining and Manufacturing Company have a relatively low permeability since their molecules are much larger than the air and water molecules.

Referring again to FIG. 17 the tubes 6,7 also include a heat shrink tubing 234 to protect the SERFINE™ layer 232 and provide a low permeability barrier to water. Incidentally, the preferred heat shrink tubing VFP8760 produced by Minnesota Mining and Manufacturing Company is rated as a fire retardant by United Laboratories (UL). Polyurethane tubing is preferred since it does not contain plasticizers which may be leached out of the vapor tube by the coolant and deposited it in the condensate tube causing the vapor tube to become shorter and harder while the condensate tube becomes longer and softer. It is contemplated that either aluminum foil or vacuum metalized aluminum may be a suitable alternative to the SERFINE™ layer. Depending on the particular design, limitations on the evaporator unit height may limit the size of the pipes connected to it and it may be necessary to use two or more tubes for either or both of the vapor tubes and the condensate tubes in order to obtain the necessary flow cross section. In general, the cross sectional area of the vapor tube will be larger than the cross sectional area of the condensate 8 tube to insure a smooth flow and to insure that pressure is not built up within the system. It is also possible to use vapor and condensate tubes which are coextruded or coaxial, but generally, in this latter case, check valves must be used in either or both of the vapor tube and the condensate tube to prevent gases from flowing up or down the condensate tube 7 and to prevent liquid from flowing up or down the vapor tube 6. It is critical that both the vapor and condensate tubes remain open to fluid flow to avoid a pressure increase in the system. If, for example, a liquid blockage develops in a u-shaped section of the vapor tube, the pressure in the evaporator will increase and thereby increase the boiling point of the coolant. Consequently, the vapor and condensate tubes must be arranged such that a free flow of vapor and liquid occurs during the operation of the device.

Figure 9:
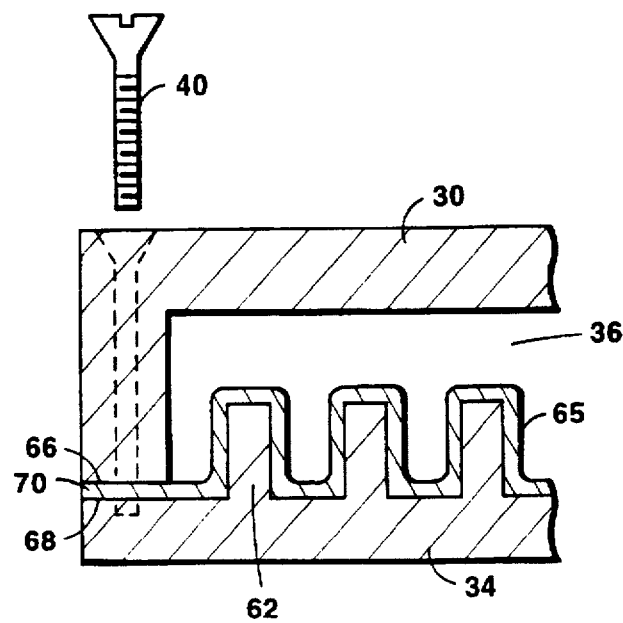
FIG. 9 is a partial cross sectional view of the evaporator unit illustrating an alternative method of assembling the unit.

FIG. 9 shows an alternative method of attaching an evaporator cover 30 comprised of polymeric material to the heat spreader plate 34. In particular, prior to assembly of the evaporator unit 5, the heat spreader plate 34 is coated with a vacuum-formed layer of polymeric material 65. Layer 65 allows the polimeric evaporator cover to be solvent cover to be solvent welded to the polymeric layer 65. In particular, during assembly, a suitable solvent is applied to the lower edge 66 of evaporator cover 30 which then bonds to the upper surface 70 of plastic layer 65 at the outer edges 68 of the heat spreader plate. Additional screws 40 can be provided to increase the mechanical integrity of the structure. The polymeric material can either be opaque, semi-opaque or non-opaque.

Figure 22:
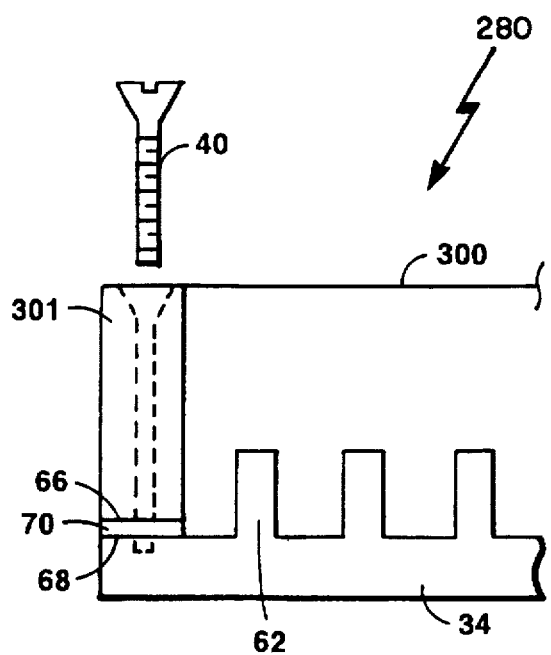
FIG. 22 is a partial cross sectional view of the evaporator unit illustrating yet another alternative method of assembling the evaporator unit.

FIG. 22 illustrates an alternative embodiment evaporator unit 260. In this embodiment evaporator ring 301 is attached to the heat spreader plate 34 with epoxy 70. A cover film 300 is heat sealed to a ring (not shown) to form a hermetic seal. As an example a suitable transparent material is MRE8410 available from American National Can Corporation. Since this material is transparent, it has the additional benefit that a user can periodically look into the system to check its operational status by seeing the coolant boiling at steady state.

Figure 10:
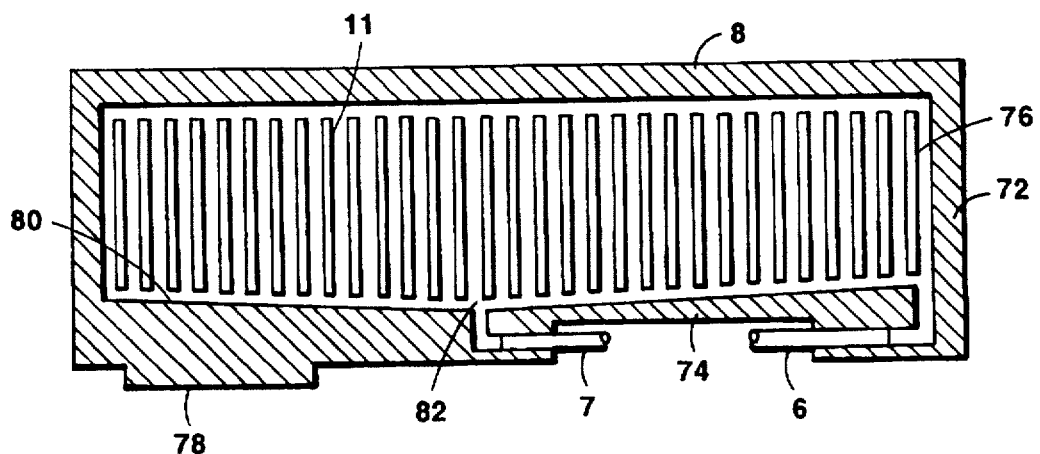
FIG. 10 is a schematic cross sectional plan view of the condenser unit taken along the section lines 10—10 in FIG. 3.

FIG. 10 shows an illustrative construction of the condenser unit 8 of the present invention. The condenser unit 8 is preferably constructed of polymeric material and shaped such that the condensate returns to the condensate line 7 under the influence of gravity. Condensate return is accomplished by making the bottom edge of the condenser unit 8 slanted so that a "sump" area 82 is formed directly over the condensate tube 7.

A baffle 76 may be added to the condenser unit 8 so that vapor entering the condenser unit 8 from the vapor tube 6 passes directly upwards to the upper portion of the condenser unit 8 and does not mingle with the condensed vapor on entry to the condenser. The condenser unit 8 shown in FIG. 10 is provided with a tab 78 which can fit into an expansion slot socket on the mother board 1 as shown in FIGS. 1–3.

Figure 11A:
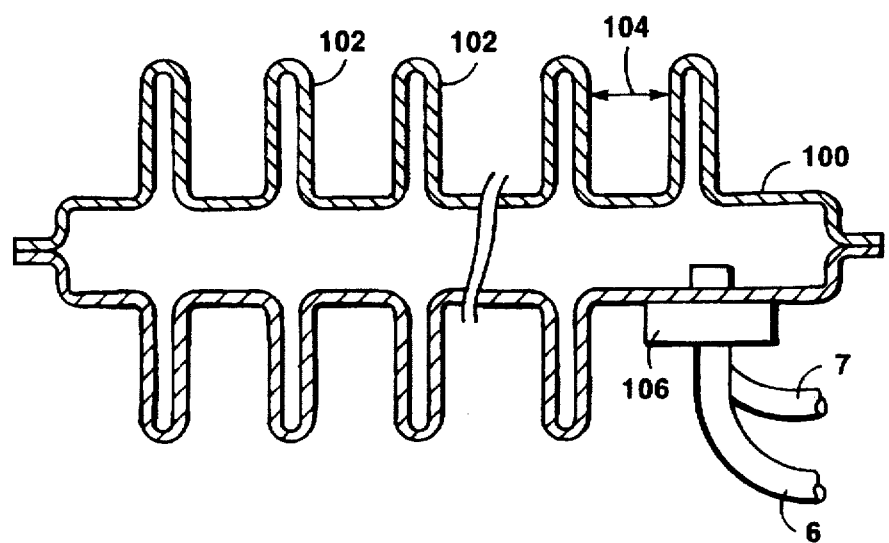
FIG. 11A is a partial cross sectional view of an embodiment of the condenser unit which is entirely comprised of flexible walls.

As previously mentioned, condenser unit 8 can be made of either thick or thin materials and can be injection-molded or blow-molded. Alternatively, where small size is desired, thin sheet materials can be used since there is a smaller thermal gradient across the material. FIG. 11A illustrates a partial cross section of an embodimement of the condenser unit which is entirely comprised of flexible sheets of polymeric material. The polymeric material 100, which may, for example, be polypropylene, can be vacuum formed over a rigid mandrel (not shown) to form the fins 102. The distance 104 between the fins is selected in accordance with conventional convection theory to maximize heat transfer between the condenser unit and the surrounding environment. The width of the fins themselves is minimized in order to increase the heat transfer from the vapor in the condenser to the condenser walls. The vapor tube 6 and the condensate tube 7 can be attached to the sheet material 100 by cementing the tubes or by suitable fittings 106.

Figure 11B:
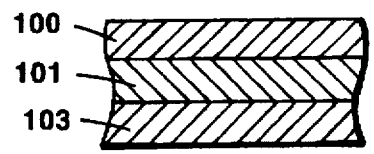
FIG. 11B is a partial cross section through a multi-layer flexible sheet as might be used in the flexible walls.

Although only a single sheet (100) of flexible material is shown in FIG. 11A, the polymeric sheets may be multi-layered to limit gas permeability. For example, as shown in FIG. 11B, the polypropylene sheets illustrated in FIG. 11A may consist of a polypropylene sheet 100 covered on one side by a layer of vapor-deposited aluminum 101. The vapor deposited aluminum 101 may, in turn, be covered by a layer of polycarbonate or KAPTON™ 103 to protect it.

Figure 12:
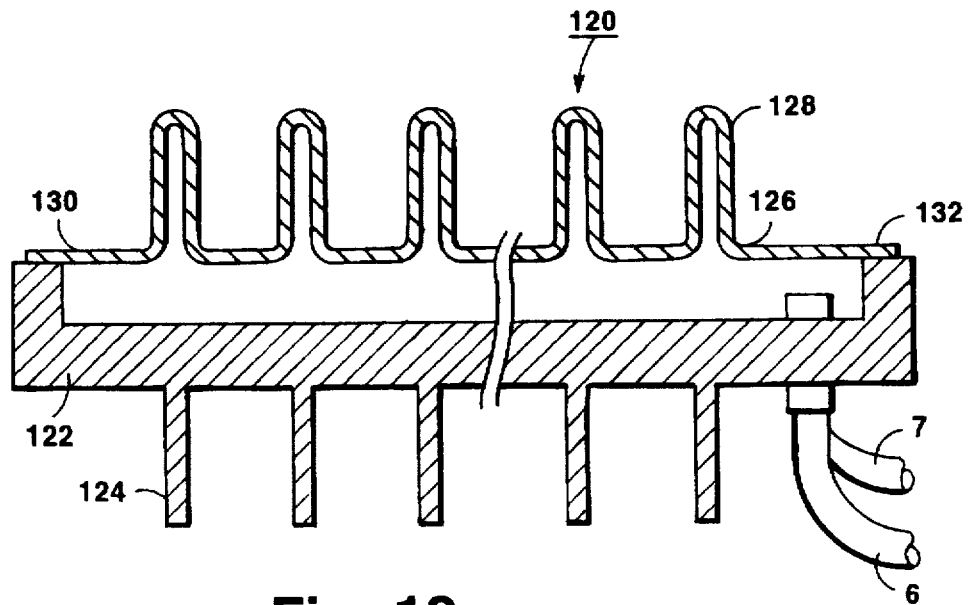
FIG. 12 is a partial cross sectional view of an embodiment of the condenser unit which is comprised partially of rigid walls and partially of flexible walls.
Figure 18:
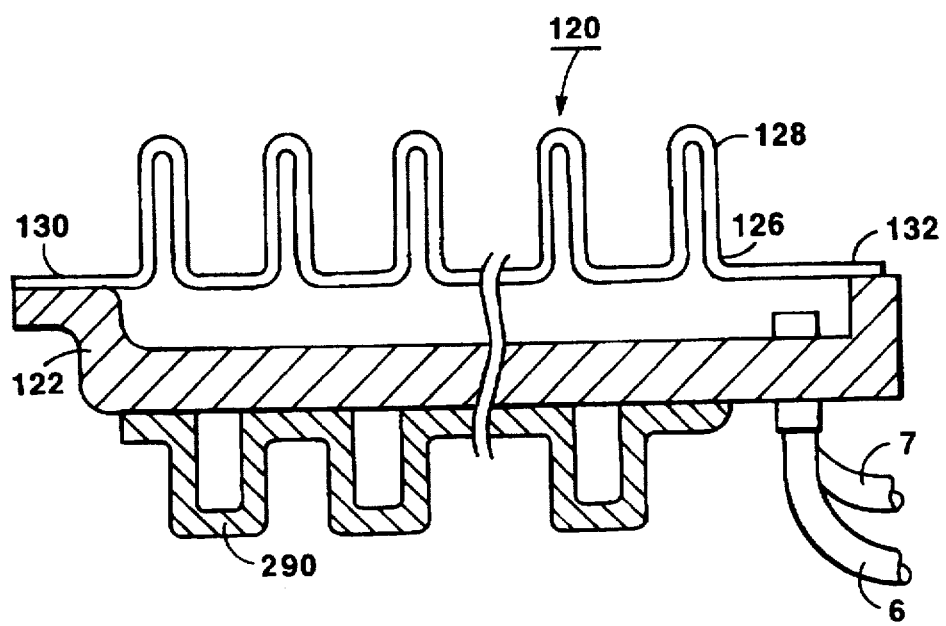
FIG. 18 illustrates an alternative embodiment having a plurality of folded fins.

It is also possible to form at least one wall of the condenser unit 8 of a thin gauge metal, for example aluminum, which metal can also be formed with fins for enhanced heat transfer. A thin flexible sheet can then be sealed to the metal wall to provide the flexible wall necessary for zero pressure operation. FIG. 12 illustrates a partial cross section of a further embodiment of the condenser unit which is partially comprised of a rigid material and partially comprised of flexible sheets. The rigid part 122 of the condenser unit 120 may be comprised of a polymeric material such as polypropylene or may be comprised of a metal such as aluminum. Fins 124 may be molded into the rigid material as shown in FIG. 12 or the rigid condenser section may consist of a smooth plate. The flexible portion 126 of the condenser may be comprised of a sheet of polymeric material such as polypropylene, and may also have fins 128 molded into it. The flexible portion 126 is heat-sealed to the rigid portion 122 in the areas 130 and 132 to form a sealed unit. In the case of a two part condenser the vapor and condensate tubes, 6 and 7, are preferably connected to the rigid portion as shown in FIG. 12. FIG. 18 illustrates an alternative embodiment having a plurality of folded fins 290 attached to the rigid portion 122 of the condenser to increase the heat dissipation of the condenser. The folded fins 290 may be attached to the rigid portion 122 by any method which provides a sufficiently strong bond between the materials such as welding, bonding with epoxies and adhesives or any other well known technique in the art. The folded fins should be spaced a sufficient distance apart to allow enough air to flow past the fins to remove the heat. As an example, spacing about 2.5 fins per inch should be sufficient for a folded fin length of about six inches if cooled by natural convection. The fins 290 may be made of 0.010 inch thick aluminum and the base plate which attach the fins to the rigid portion of the condenser should be slightly thicker, such as 0.020 inches thick.

Figure 13:
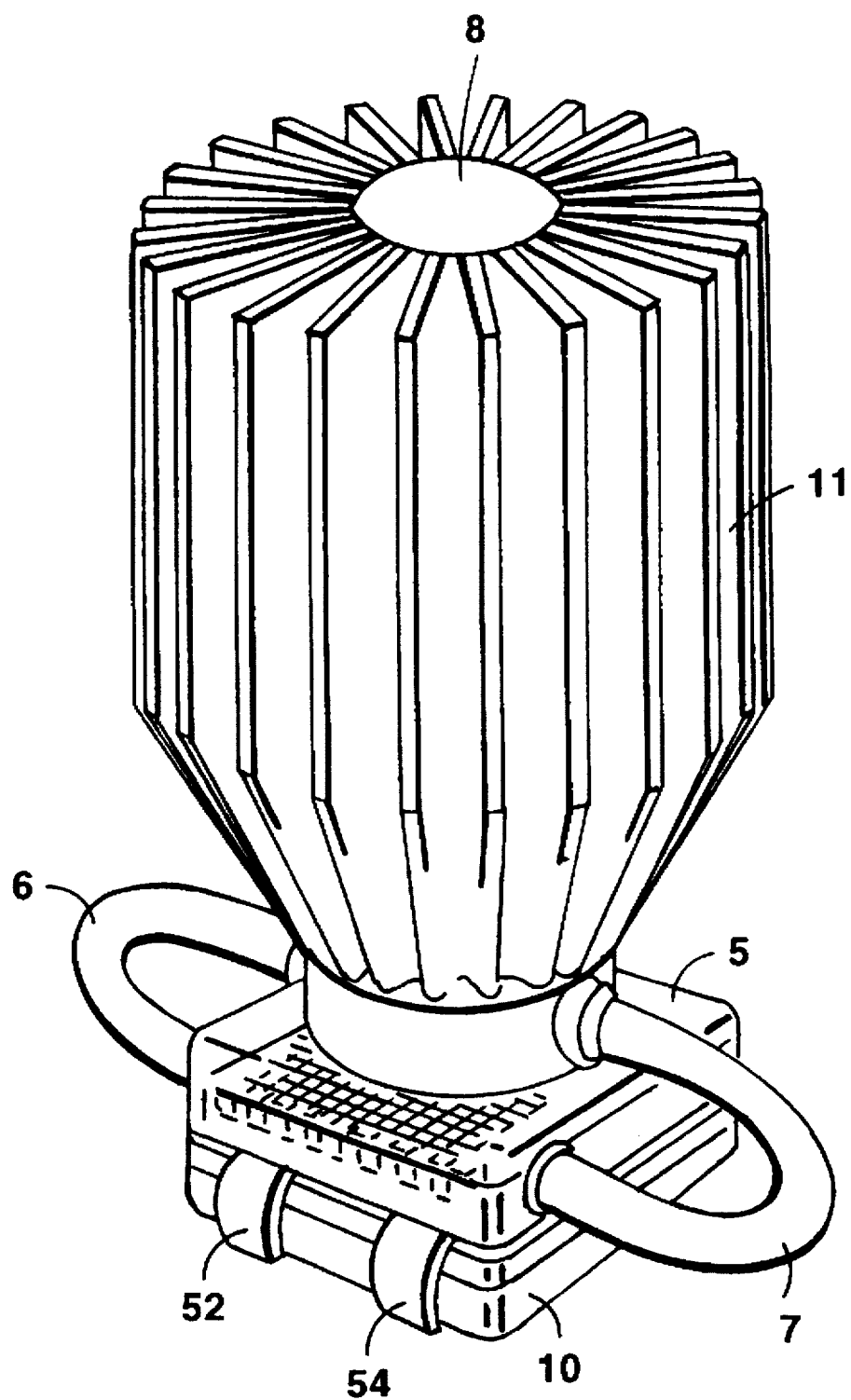
FIG. 13 is a perspective view illustrating an embodiment in which a condenser unit 8 with a circular cross section is mounted on top of the evaporator unit.

Condenser unit 8 may also have spatial configurations different from that shown in FIG. 10. For example, condenser unit 8 may be circular, or square in cross section. The condenser unit 8 can also be located in almost any expansion slot location as shown in FIGS. 1–3. In lap-top, portable notebook and sub notebook size computers, the condenser unit 8 may be located on the backside of a flip-up display screen typically found in such computers. A "chimney" enclosure can also be used to increase efficiency. Other locations for the condenser unit 8 include the inlet or outlet of the power supply box 2. In designs where vertical height is not a problem above the chip 10 that is to be cooled, it is also possible to mount the condenser unit 8 on top of the evaporator unit 5. Such a configuration is shown in FIG. 13 which illustrates a condenser with a circular cross section. In cases where space permits the condenser unit 8 to be mounted on top of the evaporator unit 5, the condenser unit 8 can also be made integral with the evaporator unit 5 thereby eliminating the need for the vapor and condensate tubes 6 and 7.

Figure 14:
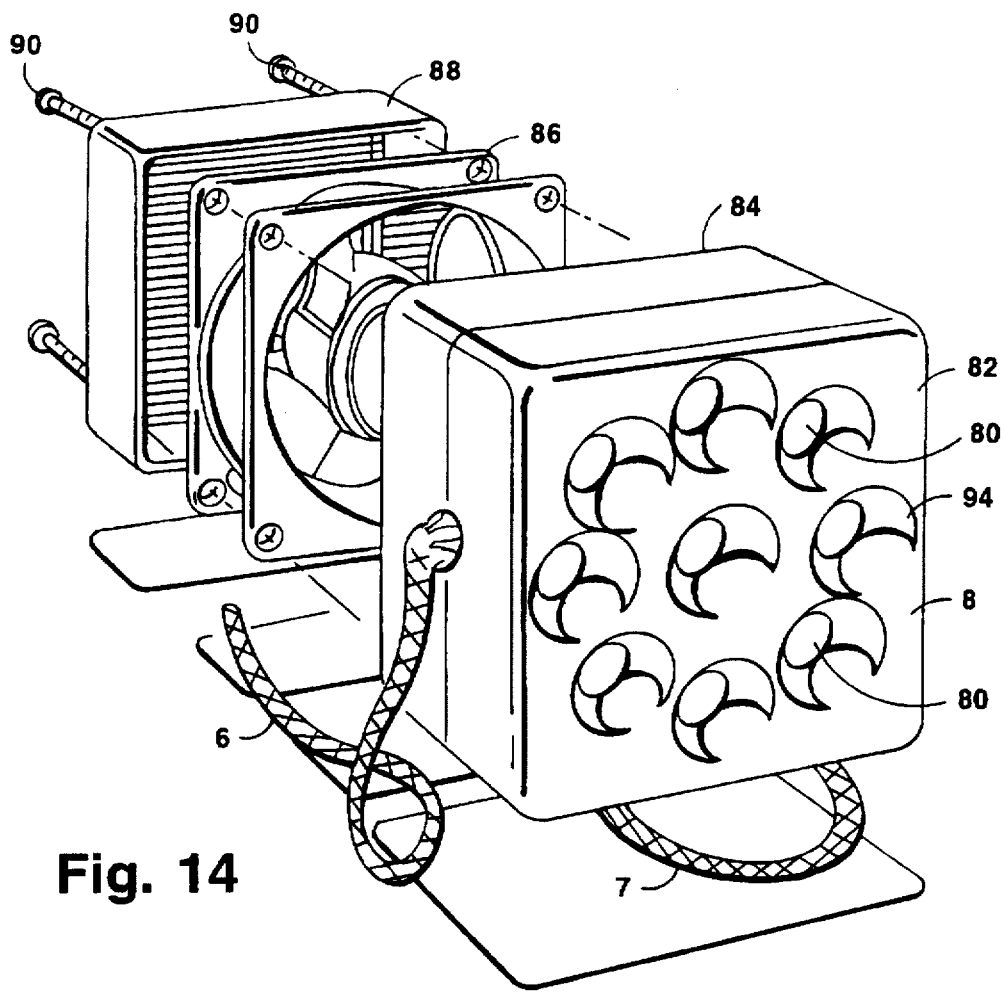
FIG. 14 is a perspective exploded view illustrating an embodiment in which a condenser unit 8 utilizes forced air flow.
Figure 15:
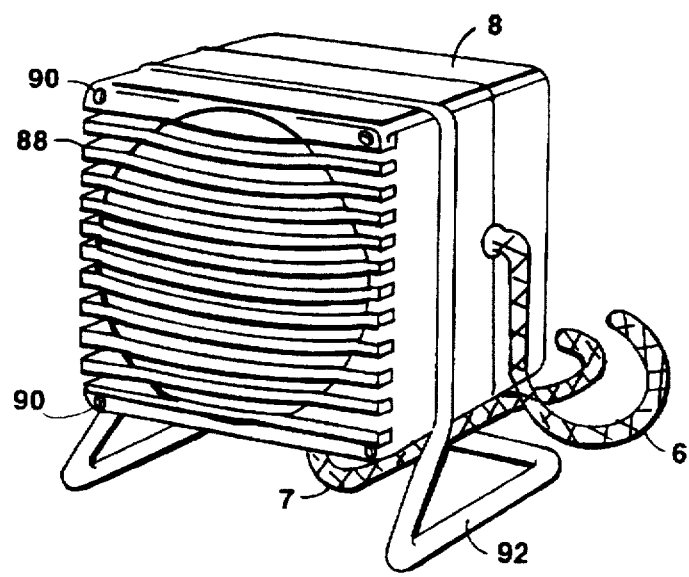
FIG. 15 is a perspective view illustrating the embodiment shown in FIG. 14 in assembled form.

In addition, it is possible to use cooling system configurations in which the airflow over condenser unit 8 is forced by a fan. FIGS. 14 and 15 show an exploded and assembled view of such an illustrative configuration, respectively. The condenser unit 8 in this embodiment comprises a unit with a substantially rectangular cross section. The condenser unit 8 has a number of through holes 80 which pass from side 82 to side 84. A conventional electric fan 86 is mounted on one side 84 of the condenser unit 8 by means of screws 90. The fan is covered by a cover 88. The unit can be mounted on a stand 92. The condenser unit 8 can be fabricated by injection or blow molding the unit 8 in two halves and sealing the halves together by cementing, heat sealing or ultrasonic welding. Bevels 94 are located around each of the holes 80 to facilitate molding of the polymeric parts.

However, as previously mentioned, because the condensate returns to the evaporator unit 5 by gravity, in all gravity-return embodiments, the condenser unit 8 must be located above the evaporator unit 5 and there must be no portion of either the vapor tubing 6 or the condensate tubing 7 that dips below the height of the evaporator unit so that no air pockets are formed in the tubing connecting the evaporator unit 5 and the condenser unit 8. However, other embodiments can use conventional pumps or wicking mechanisms to return the condensate to the evaporator unit 5. In these cases it is not necessary for the condenser unit 8 to be above the evaporator unit 5.

In any case, at least one flexible wall is provided in the system which allows the system to change in volume in order to maintain the internal system pressure substantially equal to the ambient pressure. Although the flexible walls have been located in the condenser in the embodiments discussed above, the flexible walls may be located in any other part of the system including the evaporator. Alternatively, either or both of the vapor and condensate conduits may be made sufficiently flexible to allow the system to operate with a zero pressure differential.

The cooling system is partially filled with a liquid coolant during operation. In general, less than fifty percent of the condenser volume is filled with liquid coolant, and preferably only about ten percent of the condenser by volume is filled with liquid coolant primarily due to cost of the coolant. A variety of coolants can be used based on several factors including, but not limited to, boiling or evaporation temperature (which should be between 55° C. and 80° C.), chemical compatibility with the components of the evaporator unit 5 and the condenser unit 8, chemical stability, toxicity and cost. Coolants which are suitable for use with the invention include ethyl alcohol, methanol and fluorochemicals, such as FLUORINERT™ manufactured by the Minnesota Mining and Manufacturing Company located in St. Paul Minn.

Contrary to prior art heat pipe designs, the present cooling system is not purged of residual gas during construction. Instead coolant is added to the system and the system is sealed including residual gas such that the internal pressure of the cooling system at ambient room temperature is the same as the ambient environment pressure (typically one atmosphere). As heat dissipated by the heat-generating integrated circuit causes the coolant to approach boiling, some of the residual gas dissolved in the coolant comes out of solution and activates nucleation sites which initiate boiling substantially at the normal boiling point of the coolant material.

Additional nucleation sites may be provided in the evaporator unit 5 by specially treating the inner surface of the evaporator unit 5, for example by laser machining the heat spreader plate and/or the interior of the evaporator cover 30 to provide a pitted surface. If the pits are of suitable shape and size, they will provide nucleation sites which ensure that the coolant boils substantially at its boiling point. The provision of suitable nucleation sites eliminates the overshoot phenomenon which is typically found in prior art devices.

Alternatively, the heat spreader plate 34 or the evaporator unit cover 30, or portions thereof, can be fabricated of sintered metal. It has been found that if the sintered metal parts are compacted to 60% –70% of their normal compacted density to produce an average pore size on the order of 100 microns, that the sintered metal parts will produce sufficient nucleation sites to initiate boiling.

Figure 16:
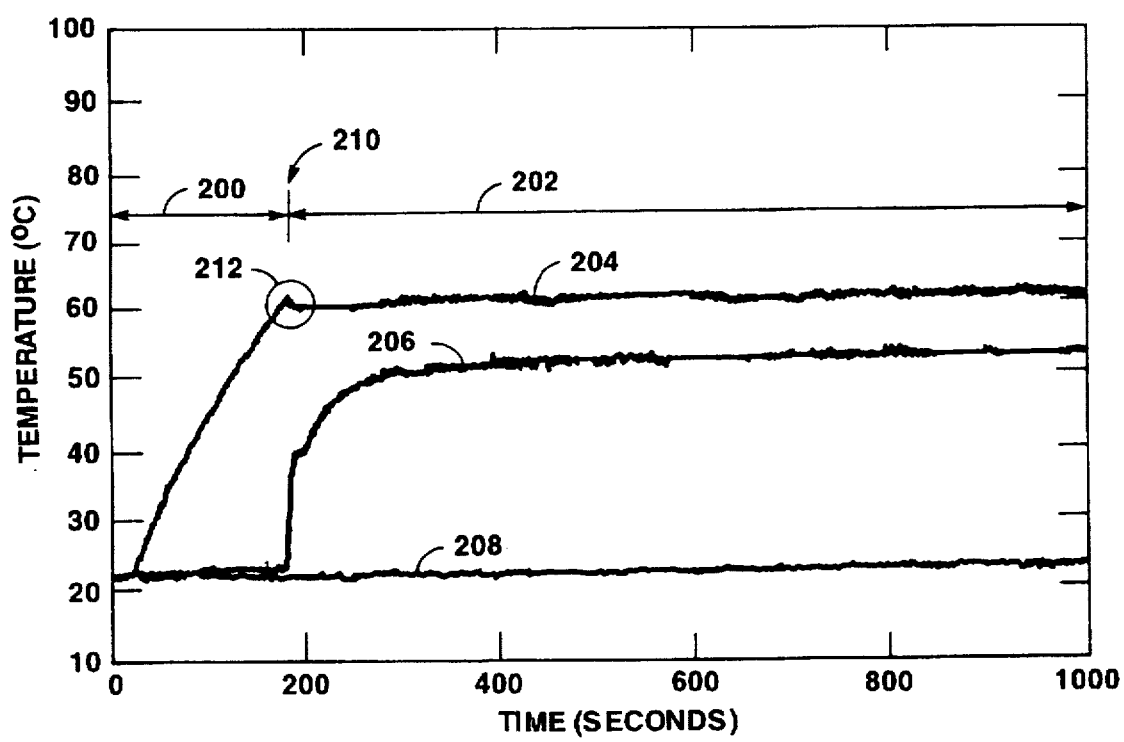
FIG. 16 is a plot of temperature versus time of the temperature of a heat dissipating component which is cooled with one embodiment of the present invention.

Due to the fact that nucleation sites have been provided in the evaporator 5, the temperature versus time curve of a typical heat-generating component using the cooling system of the present invention is shown in FIG. 16. In FIG. 16, line 204 represents the temperature of evaporator 5 versus time, line 206 represents the surface temperature of condenser unit 8 versus time and line 208 represents the ambient environmental temperature versus time. As can be seen from the figure, the initial temperature of the evaporator unit 5 steadily rises as all of the cooling system units heat up (the time period illustrated as 200 in FIG. 16). However, once the coolant boiling point temperature is reached at approximately point 210, the evaporator unit 5 temperature stabilizes and remains relatively constant over the time period 202. There is very little overshoot in the area 212 when the coolant boiling temperature is reached.

According to another aspect of the present invention, the two-phase cooling system of the present invention can be adapted to work in high altitude and high temperature condition, without having to physically size the condenser for the worst case high altitude/low boiling point/high temperature condition. It has been observed experimentally that at high altitude and/or high ambient temperature the condenser portion of the system containing the flexible wall puffs up when the rate of heat input from the component is larger than the current ability of the system to dissipate heat to the environment. Puffing is often unacceptable for two phase cooling devices which have to operate in tight confines.

Before explaining the solution to the puffing problem and high altitude and high ambient temperature operating conditions, it may be helpful to first explain the relationship between pressure and temperature versus the cooling ability of the two phase component cooler according to the well known heat transfer equation:

$$Q = h * A * \Delta T \qquad (\text{Eq. 1})$$

where:

Q=heat dissipated by the cooling system;

h=heat transfer coefficient;

A=utilized condenser surface area for condensation;

$\Delta T = T_{CONDENSATION} - T_{AMBIENT}$;

$T_{CONDENSATION}$=temperature at which the liquid coolant condensates;

$T_{AMBIENT}$=the temperature of the ambient air.

It is known that the value of Tcondensation is directly proportional to the internal pressure of the system. Hence, if the internal pressure of the system is allowed to follow the ambient pressure while operating at high altitude, the value of $T_{CONDENSATION}$ is reduced since the internal pressure is reduced at altitude in comparison to sea level conditions. It was thought prior to recent experimentation that since the value of $T_{CONDENSATION}$ was reduced at altitude in a system which equalizes internal pressure and ambient pressure, the system's cooling ability (as measured by Q in Eq. 1) would be diminished at higher altitudes unless there was sufficient unutilized condenser surface area available. As demonstrated by the experiment at sea level, the surface temperature of the condenser is warm only at a fraction of the height the coolant reservoir. The rest of the condenser is cool and not being utilized for heat transfer. At higher altitudes the surface of the condenser is warmer further away from the coolant reservoir since additional surface area is required for cooling. That is, referring to Eq. 1, it was thought that the only way to ensure that the system's cooling ability remained relatively constant over an altitude range and temperature range, was to ensure there was sufficient condenser area available to allow the utilized condenser surface area A to increase in order to offset decreasing $\Delta T$. Therefore, the prior art concluded that the only way to provide the necessary cooling at high altitude and/or high ambient temperature operating conditions was to provide a condenser large enough to offset the reductions in the $\Delta T$ term at altitude and high ambient temperature. However, it has been found that once the condenser reaches a point where all the available condenser surface is being utilized to condense the vapor (i.e., A is at its maximum), the internal pressure within the condenser will increase. This causes $T_{CONDENSATION}$ increase since $T_{CONDENSATION}$ is directly proportional to internal pressure. As a result, as the internal pressure increases, $\Delta T$ increases which leads to an increase in the system's heat dissipation ability, Q. Therefore, in accordance with one aspect of the invention, condenser sizes can be reduced, and the operational characteristics of the two phase component cooler can be adjusted by selecting the appropriate size condenser.

Figure 19:
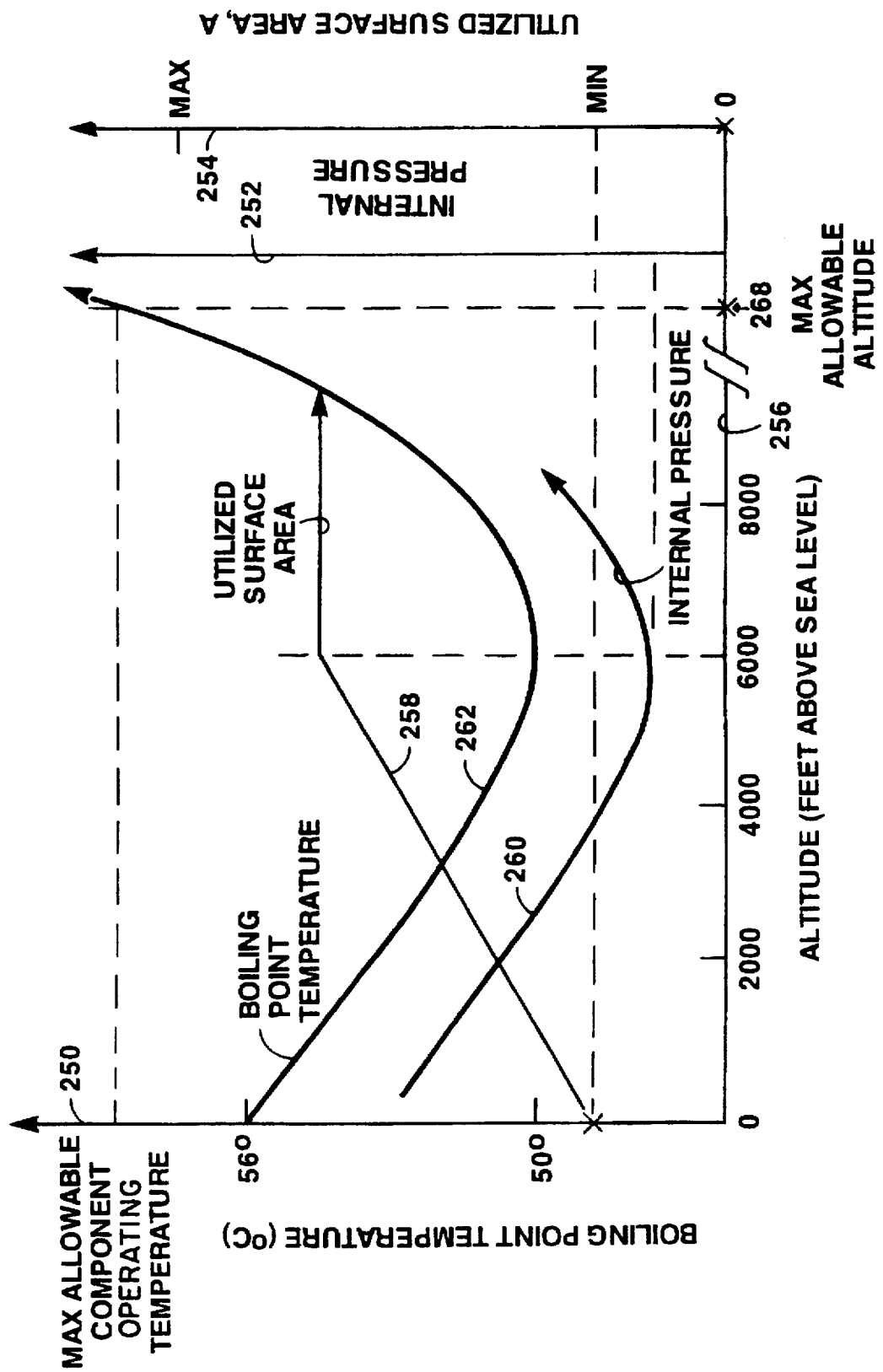
FIG. 19 is a plot of boiling point temperature, internal pressure and utilized condenser surface area all plotted as a function of altitude.

To graphically illustrate this aspect of the invention to condenser designs, FIG. 19 is an empirical plot of the boiling point temperature $T_{CONDENSATION}$, internal pressure and utilized condenser surface area A, all plotted as a function of altitude for a constant ambient temperature. The boiling point temperature $T_{CONDENSATION}$ is plotted along a first vertical axis 250, internal pressure is plotted along a second vertical axis 252 and condenser utilized surface area A is plotted along a third vertical axis 254. The operating altitude of the system above sea level is plotted along a horizontal axis 256. At sea level the boiling point of the liquid coolant is about 56 deg C. (for the FLUORINERT™ coolant FC-72 from 3M™), the surface area A is at a minimum value and the internal pressure in the condenser is at ambient. Assuming that the cooling requirements of the component are constant, as altitude increases the surface area A of the condenser utilized to condense the vapor for cooling increases along a line 258 since ambient pressure decreases, causing the internal pressure to decrease along a line 260. Similarly, the boiling point temperature $T_{CONDENSATION}$ decreases since it is proportional to internal pressure. The utilized surface area A will continue to increase along the line 258 as the altitude increases until all the available area has been utilized. Once this occurs, the utilized surface area A remains constant as altitude increases while the internal pressure plotted on the line 260 and the boiling point temperature $T_{CONDENSATION}$ plotted along the line 262 both start to increase as a function increasing altitude. Clearly the system will have a maximum allowable operating, altitude 268 which may be set at the altitude where the value of $T_{CONDENSATION}$ becomes greater than the maximum allowable nominal operating temperature of the component being cooled.

Figure 20:
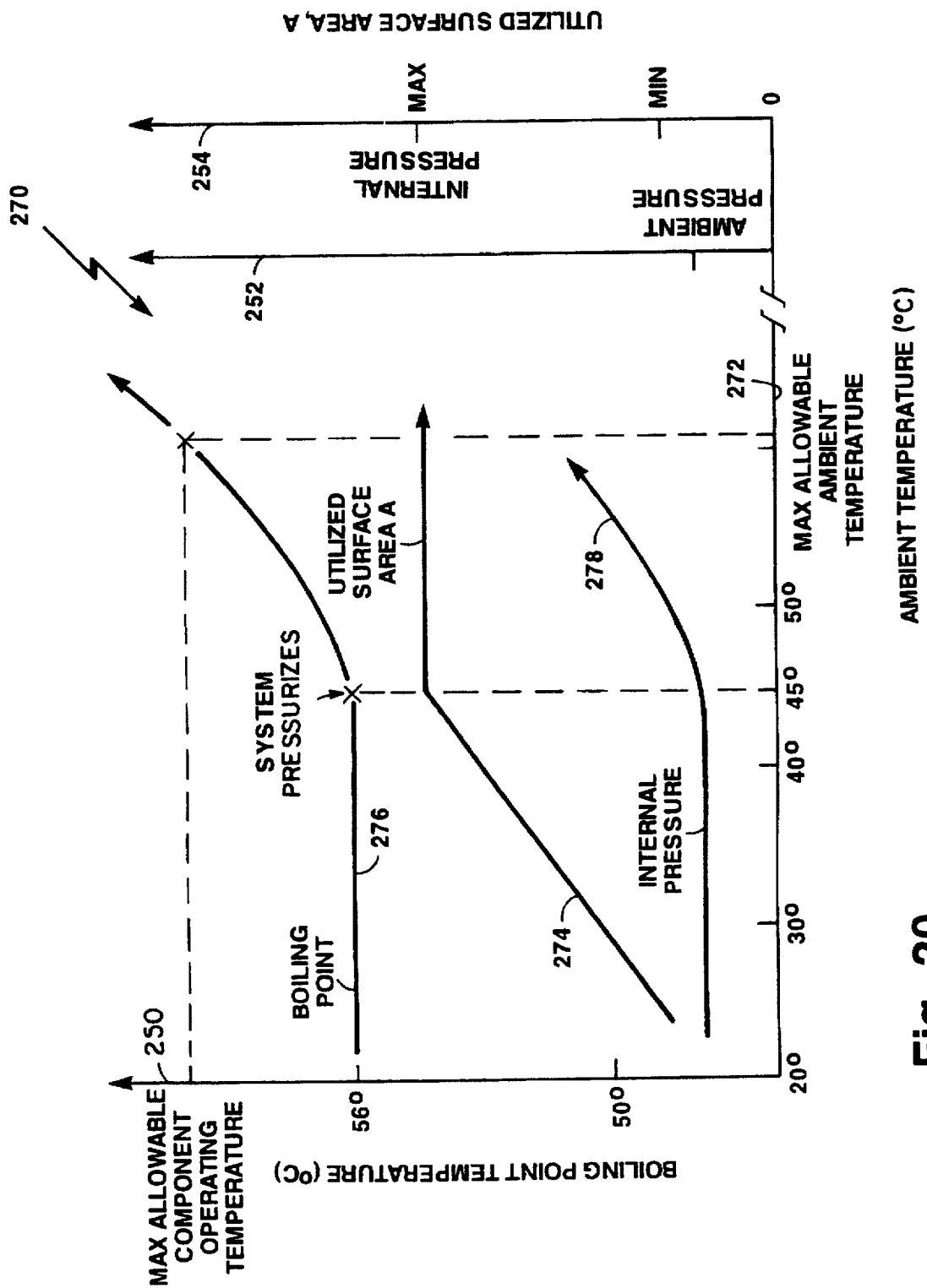
FIG. 20 is a plot of boiling point temperature, internal pressure and utilized condenser surface area all plotted as a function of ambient temperature.

FIG. 20 is an empirically derived plot 270 based on Eq. 1, of the boiling point temperature $T_{CONDENSATION}$, internal pressure and utilized condenser surface area A, all plotted as a function of ambient temperature for a constant altitude. The boiling point temperature $T_{CONDENSATION}$ is plotted along the first vertical axis 250, internal pressure is plotted along the second vertical axis 252 and utilized condenser surface area A is plotted along the third vertical axis 254. The operating ambient temperature of the system is plotted along a horizontal axis 272. At sea level the boiling point of the liquid coolant is about 56 deg C. (for the FLUORINERT™coolant FC-72 from 3M™), the utilized surface area A is at a minimum value and the internal pressure of the condenser is at ambient. Assuming that the cooling requirements of the component are constant, as ambient temperature increases the surface area A of the condenser utilized to condense the vapor for cooling increases along a line 274 since $T_{AMBIENT}$ (see Eq. 1) increases. The boiling point temperature plotted along a line 276 and internal pressure plotted along a line 278 both remain relatively constant until the utilized surface area A plotted along the line 274 reaches the maximum available area, which for illustration purposes is shown as occurring at 45 deg C. Once all the surface area is being utilized to condense heat, in order to continue dissipating more heat from the component the system will increase both the internal pressure plotted along the line 278 and the boiling point temperature $T_{CONDENSATION}$ plotted along the line 276. Referring to Eq. 1, since the utilized surface area A has reached a maximum, increasing $T_{CONDENSATION}$ in response to increasing values of $T_{AMBIENT}$ allows the system to continue meeting the system cooling demands. Analogous to the situation plotted in FIG. 19, the system will have a maximum allowable ambient temperature which the system can operate at either because $T_{CONDENSATION}$ has reached the maximum allowable component operating temperature or because the internal pressure increases to a maximum value.

Figure 21A:
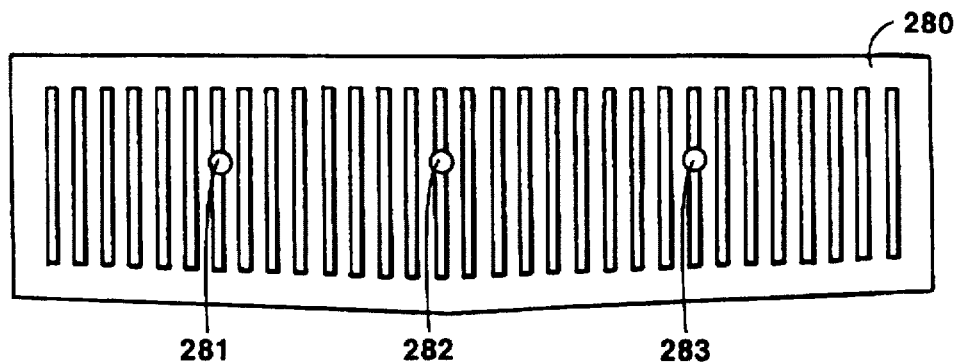
FIGS. 21A is a front view of a condenser having reinforcing dimples to reduce the expansion of the condenser.
Figure 21B:
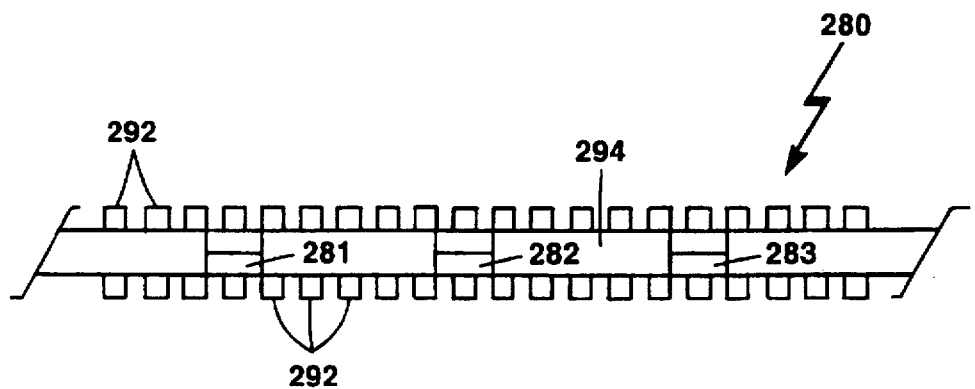
FIGS. 21B is a cut-a-way top view of a portion of the condenser of FIG. 21 A.

FIG. 21A illustrates a from view of an alternative embodiment of a condenser 280, essentially similar to the condenser illustrated in FIG. 10, with the exception that the condenser 280 in FIG. 21A includes a plurality of dimples 281–283 which join the frontal and rear sections of the condenser to ensure that the condenser can only expand a controlled amount since it 280 may occasionally operate in a pressurized mode. The dimples 281–283 provide reinforcement to the condenser structure which makes it more suitable for pressurization. As more dimples are added to the condenser, the structure will become more rigid and less expansion (i.e., puffing) will occur. This is particularly helpful when the condenser has to operate in a tight confine with a very limited expansion area. Dimples are not the only reinforcement mechanism contemplated for use in the present invention. A line of vertically oriented pleats designed to mate when the condenser is formed may withstand higher internal pressure since the pleats conceivably have more surface area. In general the values for the both: i) the amount the condenser is allowed to expand, and ii) the internal pressure which the condenser must withstand, will be selected as a function of the maximum operating altitude and/or the maximum operating ambient temperature. Additional system design criteria includes the component manufacturer's recommended temperature operating range with an objective of ensuring that the two-phase component cooler of the present invention maintains the temperature of the component within the manufacturer's recommended range. FIG. 21B is cut-away top view of a portion of the condenser 280 illustrating the dimples 281–283 of the front and rear sections of the hermetically sealed condenser in bonded contact. The condenser also includes a plurality of fins 292 and a hermetically enclosed interior region 294.

The benefits to the limited expansion embodiment of FIGS. 21A–B include: 1) the condenser will not expand into additional components, 2) the system can dissipate more heat at higher altitudes and temperatures, 3) the temperature variation of the device over a range of altitudes is decreased, and 4) the component's reliability is increased since it the component cooler can be designed to operate at relatively cool temperatures at altitudes higher than sea level.

A designer wishing to employ the two-phase cooling system of the present invention will have several choices. If sufficient room is available at the operational environment where the condenser will be located, the condenser can be sized large enough such that sufficient condenser surface area is available for entire range of ambient operating pressure and temperature. On the other hand, if operational environment space is tight, a smaller condenser can be used and the condenser designed to operate in a pressurized mode as shown in the plots of FIGS. 19 and 20. In general, employing a condenser utilizing the pressurized mode of operation based on the experimental observations discussed herein allows a two phase component cooler to operate in tight operational confines.

Although the present invention has been described in the context of several different embodiments, the invention is clearly not limited to these embodiments. As an example, rather than locating the two phase component cooler within an expansion slot of a personal computer the component cooler may be located outside the computer cabinet such as adjacent to the computer's fan which is an area of active air flow. In addition, besides the materials discussed herein, it is contemplated that materials such as BAREX™ produced by Greenway Industries and films containing ethel vinyl alchohol may also be suitable for use in the condenser.

One of ordinary skill in the art will appreciate that the component cooler of the present invention is clearly not limited to electrical components within personal computers; any component which requires cooling may employ the reliable, inexpensive two phase component cooler of the present invention foregoing description has been limited to specific embodiments of this invention. It will be apparent, however, that variations and modifications may be made to the disclosed embodiments of the invention, with the attainment of some or all of its advantages. For example, it will be obvious to those skilled in the art that the present invention can be used with components other than the specific electronic components disclosed. An example of a potential use is to cool the motor of an electric automobile. Therefore, it is the object of the appended claims to cover all such variations and modifications as come within the true spirit and scope of the invention.

What is claimed is:

1. Apparatus for cooling a heat dissipating component, the apparatus operating in an environment with an ambient pressure over a temperature range comprising a low range and a high range, the apparatus comprising:

a hermetic enclosure having an interior partially filled with a noncondensing residual gas and having an internal pressure, a first thermally conductive wall in thermal communication with the component for conducting heat dissipated from the component into the enclosure interior and a second wall, wherein the enclosure has a limited range of expandability which results in the internal pressure remaining substantially at the ambient pressure over said low range of the apparatus, and being at pressures significantly higher than the ambient pressure over said high range; and a liquid coolant disposed within the hermetic enclosure interior, the liquid coolant having a sufficiently low boiling point that the liquid coolant is changed to a vapor by the heat dissipated from the component in both the low range and the high range, wherein said noncondensing gas is soluble with said liquid coolant.

2. Apparatus according to claim 1 wherein the hermetic enclosure comprises:

an evaporator unit comprising in part the first wall;

a condenser unit;

a conduit connecting the evaporator unit and the condenser unit.

3. Apparatus according to claim 2 wherein the second wall is part of the evaporator unit.

4. Apparatus according to claim 2 wherein the second wall is part of the condenser unit.

5. Apparatus according to claim 2 wherein the second wall is part of the conduit.

6. Apparatus according to claim 2 wherein the evaporator unit has an interior and at least a portion of the evaporator unit interior is surface treated to produce nucleation sites to promote boiling of the liquid coolant.

7. Apparatus according to claim 6 wherein the portion of the evaporator unit interior is laser-machined.

8. Apparatus according to claim 1 wherein at least a portion of the enclosure interior is surface treated to produce nucleation sites to promote boiling of the liquid coolant.

9. Apparatus according to claim 8 wherein the portion of the enclosure interior is laser-machined.

10. Apparatus according to claim 7 where the noncondensing gas is air.

11. A two-phase cooling device for cooling a heat dissipating component, the device operating over a temperature range comprising a low range and high range and comprising:

an evaporator unit;

a condenser unit;

a liquid coolant disposed within the device, the liquid coolant having a sufficiently low boiling point that the liquid coolant boils to a vapor by the heat dissipated from the component in both the low range and the high range;

a first conduit connecting the evaporator unit and the condenser unit to allow the vapor to flow from the evaporator unit to the condenser unit wherein the vapor condenses to a condensate;

a second conduit connecting the evaporator unit and the condenser unit to allow the condensate to flow from the condenser unit to the evaporator unit, the evaporator unit, the condenser unit, the first conduit and the second conduit all forming a hermetic enclosure with an internal pressure which is partially filled with a noncondensing gas which is soluble with said liquid coolant;

wherein the enclosure comprises at least one wall having limited flexibility which results in the internal pressure remaining substantially at the ambient pressure over said low range of the device and being at pressures significantly higher than ambient pressure in the high range.

12. Apparatus according to claim 11 wherein the wall is part of the evaporator unit.

13. Apparatus according to claim 11 wherein the wall is part of the condenser unit.

14. Apparatus according to claim 11 wherein the evaporator unit has an interior and at least a portion of the evaporator unit interior is surface treated to produce nucleation sites to promote boiling of the liquid coolant.

15. Apparatus according to claim 14 wherein said portion of the evaporator unit interior is laser-machined.

16. Apparatus according to claim 11 wherein the condenser unit is comprised of a rigid wall and a flexible wall.

17. Apparatus according to claim 12 wherein the evaporator unit is comprised of an evaporator cover and a heat spreader plate.

18. Apparatus for cooling a heat dissipating component, the apparatus operating over a temperature range comprising a low range and a high range, the apparatus comprising:

a hermetic enclosure having an interior with an internal pressure, a first thermally conductive wall in thermal communication with the component for conducting heat dissipated from the component into the enclosure interior, wherein the enclosure has a limited range of expandability such that the internal pressure remains substantially at the ambient pressure over said low range of the apparatus, and operates at pressures significantly higher than the ambient pressure over said high range; and a liquid coolant disposed within the hermetic enclosure interior, the liquid coolant having a sufficiently low boiling point that the liquid coolant is changed to a vapor by the heat dissipated from the component in both the low range and the high range.

\* \* \* \* \*